(12) United States Patent
Heinzle et al.

(10) Patent No.: US 12,007,427 B2
(45) Date of Patent: Jun. 11, 2024

(54) ELECTRICAL CIRCUIT

(71) Applicant: Baur GmbH, Sulz (AT)

(72) Inventors: Stefan Heinzle, Bregenz (AT); Mathias Hupp, Tschagguns (AT); Manfred Bawart, Sulz (AT); Martin Jenny, Dornbirn (AT)

(73) Assignee: Baur GmbH, Sulz (AT)

( * ) Notice: Subject to any disclaimer, the term of this patent is extended or adjusted under 35 U.S.C. 154(b) by 67 days.

(21) Appl. No.: 17/916,105

(22) PCT Filed: Mar. 29, 2021

(86) PCT No.: PCT/EP2021/058094
§ 371 (c)(1),
(2) Date: Sep. 30, 2022

(87) PCT Pub. No.: WO2021/198146
PCT Pub. Date: Oct. 7, 2021

(65) Prior Publication Data
US 2023/0204649 A1 Jun. 29, 2023

(30) Foreign Application Priority Data

Mar. 31, 2020 (AT) .................................... A81/2020

(51) Int. Cl.
*G01R 31/12* (2020.01)
*G01R 31/08* (2020.01)
(52) U.S. Cl.
CPC ....... *G01R 31/1272* (2013.01); *G01R 31/086* (2013.01)
(58) Field of Classification Search
None
See application file for complete search history.

(56) References Cited

U.S. PATENT DOCUMENTS

2016/0161543 A1* 6/2016 Andle .................... G01R 31/14
324/551

FOREIGN PATENT DOCUMENTS

CN 209264895 8/2019
DE 102011006098 9/2012
(Continued)

OTHER PUBLICATIONS

"Application of HFCT and UHF sensors in On-line Partial Discharge Measurements for Insulation Diagnosis of High Voltage Equipment", Fernando Álvarez et al., Sensors 2015, 15, 7360-7387 (Mar. 25, 2015).

(Continued)

*Primary Examiner* — Farhana A Hoque
(74) *Attorney, Agent, or Firm* — Volpe Koenig

(57) ABSTRACT

An electrical circuit for connecting an electrical measurement device (16), which is used to measure partial discharges in a power grid having an operating voltage in the range of 1-69 kV, and which has an A/D converter (17) for converting a measured voltage pulse into a digital signal and has a microprocessor unit (18) for evaluating the digital signal, with a measurement output of a capacitive voltage testing system (3) of switchgear for the power grid having the operating voltage in the range of 1-69 kV. The electrical circuit (8) has a frequency response matching resistor (9) which is connected between an input line (10) for connection to the live pole of the measurement output and to ground, and has a high-pass filter (11) connected down-circuit of the frequency response matching resistor (9).

19 Claims, 5 Drawing Sheets

(56) References Cited

FOREIGN PATENT DOCUMENTS

| | | |
|---|---|---|
| EP | 2204660 | 7/2010 |
| EP | 2863553 | 4/2015 |
| EP | 2866041 | 4/2015 |
| WO | 9635128 | 11/1996 |
| WO | 9816841 | 4/1998 |
| WO | 98/37427 A1 | 8/1998 |
| WO | 2004/013642 A2 | 2/2004 |

OTHER PUBLICATIONS

Zhang Min et al. "Experimental Study on the Effectiveness of Partial Discharge Detection in Switchgear Based on Non-contact UHF sensing" 2019 IEEE Sustainable Power and Energy Conference (ISPEC), IEEE, Nov. 21, 2019 (Nov. 21, 2019), pp. 2808-2811.
Meng, "The use of multiple sensors, of electrical and non-electrical type, for online PD measurement of cables, transformers, switchgears and motors," TechCon, SE Asia (2019).
IEC 60270, International Standard, High-voltage test techniques - Partial discharge measurements, Edition 3.0 (Nov. 2015).
CEI IEC 60270, International Standard, High-voltage test techniques—Partial discharge measurements, Third Edition (Dec. 2012).
IEC 61243-5:1997, Live working—Voltage detectors—Part 5: Voltage detecting systems (VDS) (1997).

* cited by examiner

ELECTRICAL CIRCUIT

TECHNICAL FIELD

The invention relates to an electrical circuit for connecting an electrical measurement device, which is employed for the measurement of partial discharges in a power grid having an operating voltage in the range of 1 kV to 69 kV, and which comprises an A/D converter for converting a measured voltage pulse into a digital signal, and a microprocessor unit for evaluating the digital signal, with a measurement output of a capacitive voltage testing system of switchgear for the power grid having an operating voltage in the range of 1 kV to 69 kV.

The invention further relates to a measuring assembly for the measurement of partial discharges at a measurement output of a capacitive voltage testing system of switchgear for a power grid having an operating voltage in the range of 1 kV to 69 kV, wherein the measuring assembly comprises an A/D converter for converting a measured voltage pulse into a digital signal and a microprocessor unit for evaluating the digital signal.

The invention further relates to a measuring system for the identification of the location of a partial discharge in a power grid having an operating voltage in the range of 1 kV to 69 kV.

BACKGROUND

Measurements of partial discharged are executed on high- and medium-voltage lines, for diagnostic purposes. In particular, the occurrence of partial discharges can be indicative of insulation defects which, over time, can result in insulation faults.

Preferably, partial discharges are measured without the necessity for the prior disconnection of the cable from the voltage supply for this purpose. To this end, the employment of "HFCT (high-frequency current transformer) sensors" is known. These are current converters comprised of two half-ring-shaped parts, about which a wire is wound (Rogowski coil) to form a closed ring, which is fitted around the cable shielding of the outgoing ground connection line of the cable which is to be measured. In the event of the occurrence of partial discharges, resulting in current pulses which flow along the ground connection line, corresponding voltage pulses are generated in the HFTC sensor, which can be detected and evaluated by a connected measurement device. A measurement device of this type comprises, inter alia, an A/D converter for converting a measured voltage pulse into a digital signal, and a microprocessor unit for processing the digital signal. A separate computer is generally connected, for the purposes of further evaluation. In this evaluation, inter alia, interference signals are filtered out, thus permitting the establishment of a conclusion with respect to the occurrence of partial discharges.

The generation of an additional synchronization signal is also known, which is synchronized with the phase of the alternating voltage, in order to determine the phase angle of partial discharge pulses thus detected, on the basis of which additional conclusions on the potential causes of partial discharges can be drawn.

An application of HFCT sensors for the measurement of partial discharges is described, for example, in "Application of HFCT and UHF sensors in On-line Partial Discharge Measurements for Insulation Diagnosis of High Voltage Equipment", Fernando Alvarez et al., Sensors 2015, 15, 7360-7387.

On-line partial discharge measurements of this type are executed in the switchgear of high- and medium-voltage grid systems. However, this is only possible in switchgear which is appropriate for this purpose. For example, an on-line connection of a HFCT sensor is not possible if the ground connection of the cable shielding is executed within the switchgear, and cannot be accessed without disconnecting the switchgear from the voltage supply, or if the ground connection of cable shielding is permanently bonded to the switchgear housing. As it is also customary for the switchgear housing to be provided with a separate ground connection, in the latter case, there is no clearly defined discharging of current pulses associated with partial discharges via the ground connection of cable shielding. In such cases, in order to install a HFCT sensor, prior disconnection from the voltage supply is required, which is associated with a corresponding degree of complexity. Alternative options for the measurement of partial discharges would therefore be advantageous.

To this end, there are existing measurement devices, which are designed for connection to HFCT sensors, employed on a measurement output of a capacitive voltage testing system (VDS) of switchgear for a power grid having an operating voltage in the range of 1 kV to 52 kV. Capacitive voltage testing systems of this type, in switchgear for power grids having an operating voltage in the range of 1 kV to 52 kV, are standardized in IEC standard 61243-5: 1997. A voltage testing system of this type comprises a coupling capacitor, fitted to the live component which is to be tested, and which is connected via a coaxial connecting line of specific length to the measurement output which is generally configured in the form of a terminal socket. The shielding of the coaxial connecting line is connected to ground. The coaxial connecting line thus constitutes a further capacitance. Thus, if a measurement device, which is designed for connection to a HFCT sensor, is connected to the terminal socket, only partial discharges occurring in the region of the switchgear, and in the immediate environment of the switchgear, are detected, but no partial discharges occurring in a more remote location.

A voltage testing system of identical design can also be employed for voltages up to 69 kV. Depending upon the definition employed, such a voltage can still be designated as a medium voltage.

In order to identify the location in a cable at which partial discharges occur, it is known for a measurement device for measuring partial discharges by means of a HFCT sensor to be coupled to the cable, and to detect the time interval between a partial discharge pulse and the time-delayed reflection of the partial discharge pulse from the remote cable end. From the propagation time difference between the partial discharge pulse and the pulse generated by reflection at the remote cable end, given a known propagation speed of the pulse, it is possible to determine the distance of the location of the partial discharge from the cable end (i.e. the length of cable between the location in the cable at which the partial discharge occurs and the cable end). This method is also described as a TDR-based measurement method.

In very long cables, however, the pulse reflected at the cable end can be damped to the extent that it cannot be detected, or cannot be reliably detected. For such cases, or for cables having complex reflection characteristics, such as T-branch or multi-branch cables, it is known for measurement devices for measuring partial discharges to be coupled to the cable at two cable ends (and, in the case of branched cables, at more than two cable ends) via HFCT sensors. For the measurement devices arranged at the cable ends, a common and high-precision time base is constituted, i.e. the measuring apparatuses comprise synchronized time detection units. Synchronization of this type can be executed, for example, on a GPS basis. The difference in propagation times of a partial discharge pulse to a respective measurement device is then evaluated. By reference to the known propagation speed of the partial discharge pulse, the difference in cable lengths traveled, and thus the location of the partial discharge, can be determined.

EP 2 204 660 A1 discloses a measurement device for measuring partial discharges, inter alia on high-voltage cables. A measuring point is connected via a coupling capacitor to the test sample, and is connected via a measuring impedance to ground. The signal which is present on the measuring point is amplified by an amplifier, and is filtered by means of various band-pass filters. This measurement device is intended to achieve an improvement vis-à-vis interference signals associated with external current sources, and to improve the separation of a plurality of superimposed partial discharge sources. This document also discloses a measurement device for measuring partial discharges, although the issue of the connection of a measurement device of this type to a measurement output of a capacitive voltage testing system of switchgear is not addressed. The same applies, in an analogous manner, to DE 10 2011 006 098 A1, which describes a measurement device for the determination of partial discharges in the insulation system of rotating electric machines. In this case, a high-pass coupler is connected to each of the stator windings. An adapter device is connected down-circuit of the coupler, which comprises a high-pass filter and a low-pass filter.

The measurement of partial discharges in off-line operation is also known. In this case, the operating voltage is disconnected, and the cable is energized with a high voltage originating from a separate high-voltage source. In this case, customarily, the tapping of partial discharge pulses, for the detection thereof by means of a measurement device, is not executed by means of HFCT sensors, but by means of a circuit according to IEC standard 60270, wherein exceptionally large and heavy coupling capacitors in the nF range are employed.

SUMMARY

The object of the invention is the extension of options for the measurement of partial discharges in medium-voltage grid systems in on-line operation, i.e. with no prior disconnection of voltage. According to the invention, this is achieved by an electrical circuit having one or more of the features described herein, by a measuring assembly having one or more of the features described herein, or by a measuring system having one or more of the features described herein.

An electrical circuit according to the invention comprises a frequency response matching resistor, which is connected between an input line, particularly a coaxial line, for connection to the live pole of the measurement output of the capacitive voltage testing system and ground, and a high-pass filter connected down-circuit of the frequency response matching resistor. By means of a circuit of this type, advantageously, a measurement device, which comprises an A/D converter for converting a measured voltage pulse into a digital signal and a microprocessor unit for evaluating the digital signal, can be connected to a measurement output of a capacitive voltage testing system (VDS) of switchgear for medium-voltage power grids, wherein the measurement output is configured, for example, in the form of a terminal socket.

By means of the frequency response matching resistor, the frequency response associated with the capacitive voltage testing system can be displaced to lower frequencies, as a result of which partial discharge pulses with lower frequency components can also be detected. Partial discharge pulses of this type, with lower frequency components, are observed where partial discharges occur, not in the immediate environment of the measuring point, but at a more distant location wherein, as a result of the low-pass characteristic of the cable, the high-frequency components of the partial discharge pulse undergo a variation or dispersion. Moreover, by the employment of a down-circuit high-pass filter, frequencies below a permissible frequency range can be sufficiently filtered out, which filtering-out is conditional to the meaningful evaluation of the measurement signal.

A capacitive voltage testing system (VDS) particularly comprises a coupling capacitor which is connected to the live part, and a coaxial line which is connected to the other terminal of the coupling capacitor, and which forms a further capacitance. The shielding of the coaxial line is connected to ground. At the end of the coaxial line which is averted from the coupling capacitor, the measurement output is located, which is configured, for example, in the form of a terminal socket, in a manner which is generally preferred.

In the context of the present document, the term medium-voltage describes a voltage range of 1 kV to 69 kV. Hereinafter, any reference to a medium voltage thus describes a voltage in this voltage range. Accordingly, a "medium-voltage grid" describes a power grid having an operating voltage in this range.

Moreover, a low-pass filter is advantageously connected down-circuit of the frequency response matching resistor. By means of the electrical circuit, in combination with the capacitive voltage testing system, an overall frequency response can thus be achieved which at least substantially corresponds to that which is obtained by the direct connection of the measurement device to a HFCT sensor.

By means of the circuit according to the invention, it is thus possible, in an advantageous manner, to employ a measurement device which is designed for use with HFCT sensors on the measurement outputs of capacitive voltage testing systems of switchgear for medium-voltage power grids, wherein the advantageously extended frequency range is mapped for partial discharge measurements.

An amplifier is advantageously arranged down-circuit of the high-pass filter and low-pass filter, as a result of which, moreover, the signal level can be advantageously adjusted to an appropriate level for the input signal of the measurement device. Preferably, an impedance matching resistor is arranged down-circuit of the amplifier, for impedance matching to the input resistor of the measurement device, in order to permit the execution of power matching (i.e. impedance matching).

A measuring assembly according to the invention for the measurement of partial discharges on a terminal socket of a capacitive voltage testing system of switchgear for medium-voltage power grids comprises an electrical circuit according to the invention, and a down-circuit measurement device comprising an A/D converter for converting a measured voltage pulse into a digital signal and a microprocessor unit for the evaluation of the digital signal.

The measuring assembly according to the invention can be comprised of an individual device (thus having an individual housing), or of two or more devices in separate housings. In particular, in the latter case, the circuit (incorporating the frequency response matching resistor and the down-circuit high-pass filter) can be accommodated in a first housing, and the measurement device, comprising the A/D converter and the microprocessor unit, can be accommodated in a separate housing, wherein at least one electrical connecting line is arranged between the two housings.

The invention also permits the execution of measurements in situations in which a measurement cannot be detected using HFCT sensors. One example is a cable which, at one end, is connected to the operating voltage of the medium-voltage power grid. In such situations, no signal can be obtained using a HFCT sensor, but can be obtained by means of the method according to the invention, or by means of the device according to the invention. The same applies to cables, the cable shielding of which is not connected to ground at the switchgear end.

In an advantageous further development of a measuring assembly according to the invention, the measuring assembly comprises a time detection unit for the detection of the time differential between voltage pulses which are detected by the measuring assembly. If the measuring assembly is connected, at one cable end, to a measurement output of a capacitive voltage testing system, the time difference between the voltage pulse which is routed directly to the measuring assembly from the location of the partial discharge, and that which is routed from the location of the partial discharge to the remote cable end, then reflected back from this remote cable end, can be detected. By reference to this time difference, and the known propagation speed of the voltage pulse, the location of the partial discharge can be determined.

Determination of the location of a partial discharge from the time differential between the direct partial discharge pulse and the partial discharge pulse which is reflected at the remote cable end is known per se. By means of the invention, however, a highly simple connection of the measuring assembly is permitted, with no interruption of the operating voltage, wherein the maximum safety of measuring personnel is achieved. No switching and handling operations in the high-voltage range are required. Remote measurement is permitted, without the necessity for the fitting of an additional partial discharge sensor.

Particularly for the measurement of very long cables, or of cables having complex reflection characteristics (T-branch or multi-branch cables), the provision of a measuring system according to the invention for the identification of the location of a partial discharge in a power grid having an operating voltage in the range of 1 kV to 69 kV is advantageous, which measuring system comprises at least two measuring assemblies according to the invention for the measurement of partial discharges on a respective measurement output of capacitive voltage testing systems, wherein the capacitive voltage testing systems are arranged at respective ends of a cable in the power grid. The measuring assemblies comprise mutually synchronizable time detection units. By means of these time detection units, a differential in the propagation times, to a respective measuring assembly, of a voltage pulse generated by a partial discharge can be detected.

From these propagation time measurements, the location in a cable at which a partial discharge occurs can be determined. In the case of T-branch cables, measuring assemblies of this type can be arranged at a plurality of cable ends on the measurement outputs of capacitive voltage testing systems.

By means of the invention, the simplest possible connection of measuring assemblies is permitted, with no interruption in the voltage supply, wherein the maximum safety of measuring personnel is achieved. No switching and handling operations in the high-voltage range are required. Remote on-line partial discharge fault measurement is also permitted on long cable systems, and on T-branch cables. In the case of T-branch cables, the measuring assembly can also be employed on cable ends in an open current circuit. Conversely, a HFCT sensor would not be employable on an open current circuit.

BRIEF DESCRIPTION OF THE DRAWINGS

Further advantages and details of the invention are described hereinafter with reference to the attached drawing. In the drawing.

DETAILED DESCRIPTION

A first exemplary embodiment of the invention is described hereinafter with reference to FIG. 1.

Figure 1:
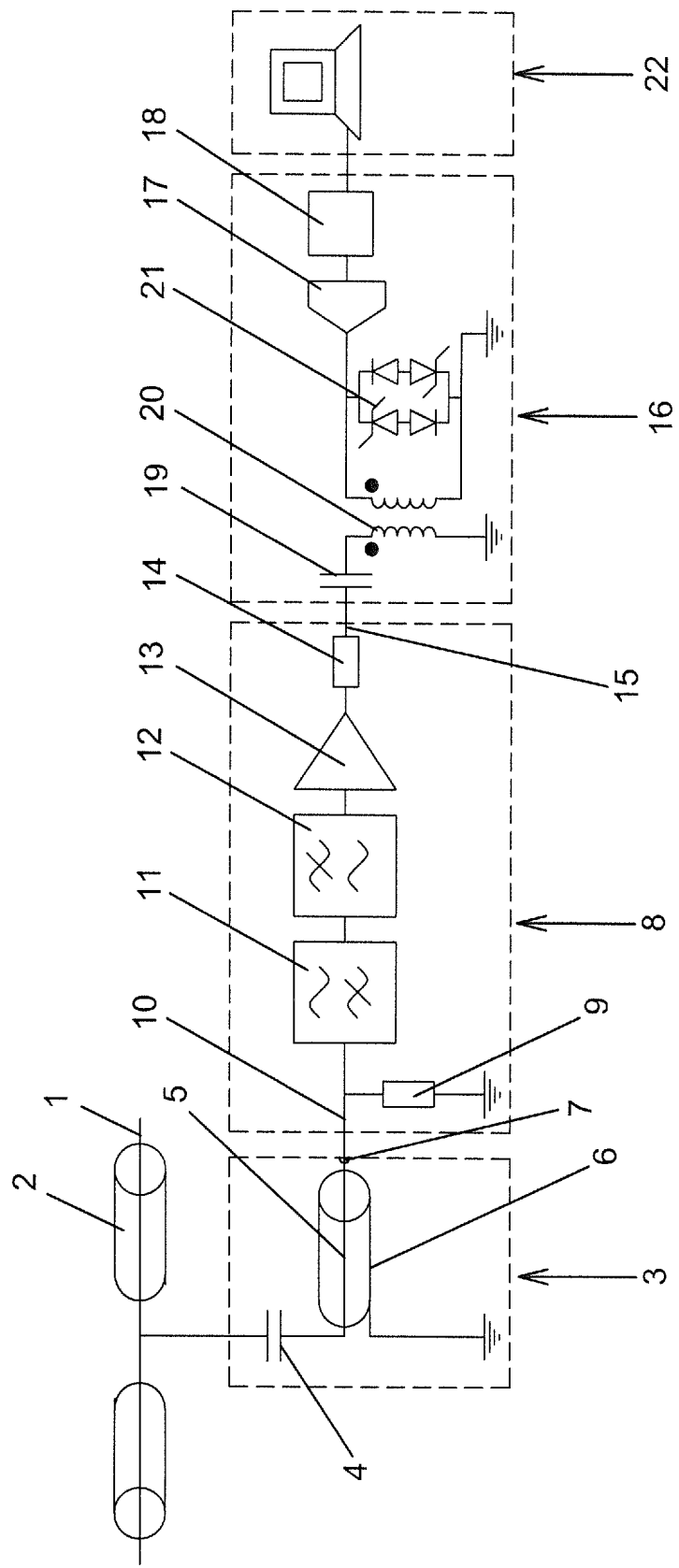
FIG. 1 shows a schematic representation of a measuring assembly incorporating a circuit according to the invention.

FIG. 1 shows a schematic representation of a conductor 1 in a medium-voltage power grid. A voltage in the range of 1 kV to 69 kV is thus present on the conductor 1. A common voltage range is 6 kV to 36 kV. A cable shielding 2 enclosing the conductor 1 is illustrated.

The conductor 1 is arranged in switchgear. Further conductors in the medium-voltage power grid can thus be connected to the conductor 1 via switches (not represented).

In order to permit the testing of the presence or otherwise of a voltage on the conductor 1, a capacitive voltage testing system (VDS) is provided, which is identified overall by the reference number 3, and is preferably configured in accordance with IEC standard 61243-5:1997. The voltage present on the conductor 1 can lie in the range of 1 kV to 52 kV, wherein higher voltages up to 69 kV are also possible (and, in the context of the present document, are still designated as a medium voltage).

The capacitive voltage testing system 3 comprises a coupling capacitor 4, which is connected to the conductor 1. The capacitance of the coupling capacitor 4 is matched to the voltage rating of the installation of the conductor 1, and can lie, for example, in the range of 3 pF to 250 pF. For voltages in the range of 30 kV to 10 kV, the capacitance particularly lies, for example, in the range of 5 pF to 30 pF. The coupling capacitor 4 is connected via the conductor 5 of a coaxial cable to a terminal socket 7, which constitutes a measurement output of the capacitive voltage testing system. The shielding 6 of the coaxial cable is connected to ground. The capacitance of the coaxial can lie, for example, in the range of 50 pF to 200 pF, and the length of the coaxial cable can lie in the range of 0.5 m to 2 m. Greater lengths, particularly up to 6 m, are possible.

At the terminal socket 7, in normal duty, an indicator light can be connected, which indicates whether the conductor 1 is live.

Between the terminal socket 7 and ground, a load resistor (not represented in the figures) can be connected, in order to limit the voltage on the terminal socket 7, where the terminal socket 7 is open.

The voltage testing system can be connected, for example, to a switchgear busbar, which is connected to a medium-voltage cable comprising the conductor 1 and the cable shielding 2. The medium-voltage cable generally comprises three conductors for the three phases, each of which is enclosed in cable shielding. Medium-voltage cables having a common cable shielding which encloses all three conductors are also known.

The capacitive voltage testing system 3 can be configured in the form of a high-resistance or low-resistance system (HR or LRM system).

For the checking of the medium-voltage power grid within a specific region around the connection point of the voltage testing system 3 to the medium-voltage power grid, a measurement of partial discharges is executed. This measurement is executed on-line, i.e. with a voltage present on the conductor 1 in the range of 1 kV to 69 kV. It is not necessary for the conductor 1 to be disconnected from the medium-voltage supply, even in preparation for measurement.

The region around the connection point in which partial discharges can be measured according to the invention can advantageously be greater than 1 km, and particularly can extend up to several km.

To this end, an electrical circuit 8 is connected to the terminal socket 7 of the voltage testing system 3, optionally further to the removal of previously connected voltage indicators or control lights. This electrical circuit 8 comprises a frequency response matching resistor 9, which is connected at one side to the input line 10 which is connected to the terminal socket 7, and at the other side to ground. The resistance rating of the frequency response matching resistor 9 is preferably greater than 25 kΩ, and preferably less than 400 kΩ, wherein a range between 50 kΩ and 200 kΩ is preferred.

The frequency response matching resistor 9 is selected such that, in conjunction with the voltage testing system 3, a high-pass is executed with a cut-off frequency of less than 1 MHz, preferably less than 200 kHz. The cut-off frequency of the high-pass filter thus configured is advantageously greater than 20 kHz, and preferably greater than 50 kHz. An exemplary cut-off frequency for a high-pass arrangement thus configured lies in the region of 100 kHz (+/−30%).

However, by means of the voltage testing system 3, in conjunction with the frequency response matching resistor 9, frequency components below the desired cut-off frequency are not filtered out to a sufficient extent. Partial discharge pulses to be measured are voltage pulses of very small magnitude, which are superimposed by various interference signals, and are thus not detectable without further action. Superimposition is associated, inter alia, with the tapped component of the medium voltage which is present on the conductor, at the corresponding frequency of this medium voltage (which lies within the range of 16⅔ Hz to 60 Hz). A high-pass filter 11 is thus arranged down-circuit of the frequency response matching resistor 9. The input of the high-pass filter 11 is connected to the input line 10. The cut-off frequency of the high-pass filter 11 advantageously corresponds, at least by order of magnitude (preferably within a range of +/−30%) to the cut-off frequency of the high-pass arrangement formed by the voltage testing system 3 in conjunction with the frequency response matching resistor 9.

A low-pass filter 12 is moreover arranged down-circuit of the high-pass filter 11. By means thereof, frequency components which exceed a desired frequency band are filtered out, wherein these, at least predominantly, are also interference components. The cut-off frequency of the low-pass filter 12 preferably lies in the range of 5 MHz to 30 MHz, for example in the region of approximately 10 MHz (+/−30%).

The low-pass filter 12 is thus connected at its input to the output of the high-pass filter 11.

A reverse arrangement of filters 11, 12 with respect to the frequency response matching resistor 9 is also conceivable and possible, i.e. the low-pass filter 12 might be connected to the frequency response matching resistor 9 (i.e. on the input line 10 of the circuit 8), and the high-pass filter 11 might be connected to the output of the low-pass filter 12.

An amplifier 13 is arranged down-circuit of the high-pass filter 11 and the low-pass filter 12. An impedance matching resistor 14 is arranged down-circuit of the amplifier 13. The input of the impedance matching resistor 14 is thus connected to the output of the amplifier 13, and the output of the impedance matching resistor is connected to the output line 15 of the circuit 8.

The function of the amplifier 13 is the matching, to an advantageous input level, of the measurement device 16 which is connected to the output line 15 of the circuit 8. The function of the impedance matching resistor 14 is the matching of the output resistance of the circuit 8 to the input resistance of the measurement device, such that the latter at least substantially coincide (preferably within a range of +/−20%).

Key components of the measurement device 16 are an analog/digital converter (A/D converter) 17 and a microprocessor unit 18. The function of the A/D converter 17 is the conversion of an analog signal which is present at the input thereof into a digital signal. This is fed to the microprocessor unit 18 for further processing.

At the input of the measurement device 16, in the exemplary embodiment, a capacitor 19, which is preferably configured in the form of a blocking capacitor, is connected, the particular function of which is the decoupling of any DC voltages which are present on the input.

A one-to-one transformer 20 can be connected to the capacitor 19, the particular function of which is galvanic isolation. The one-to-one transformer can have a resistance, for example, of 50Ω.

A diode protection circuit 21 is advantageously connected to the one-to-one transformer 20, the particular function of which is the limitation of the potential value. In the exemplary embodiment, the A/D converter 17 is connected to the diode protection circuit 21.

The structure of the measurement device 16 is known. A measurement device which is configured in this manner can be connected to a HFCT sensor, for the measurement of partial discharges.

The output of measurement signals from the microprocessor unit is fed to an output line. In the exemplary embodiment, a separate computer 22 is connected thereto. In the latter, inter alia, a further separation of voltage pulses generated by partial discharges from interference voltage components is executed. In particular, pulse-shape detection is executed for this purpose.

The computer 22 is also employed for the representation of measurement results. The computer 22 can also provide a communication interface for a user.

Connection to the computer 22 can also be executed wirelessly, by means of a WiFi connection, or by means of an optical conductor.

Figure 2:
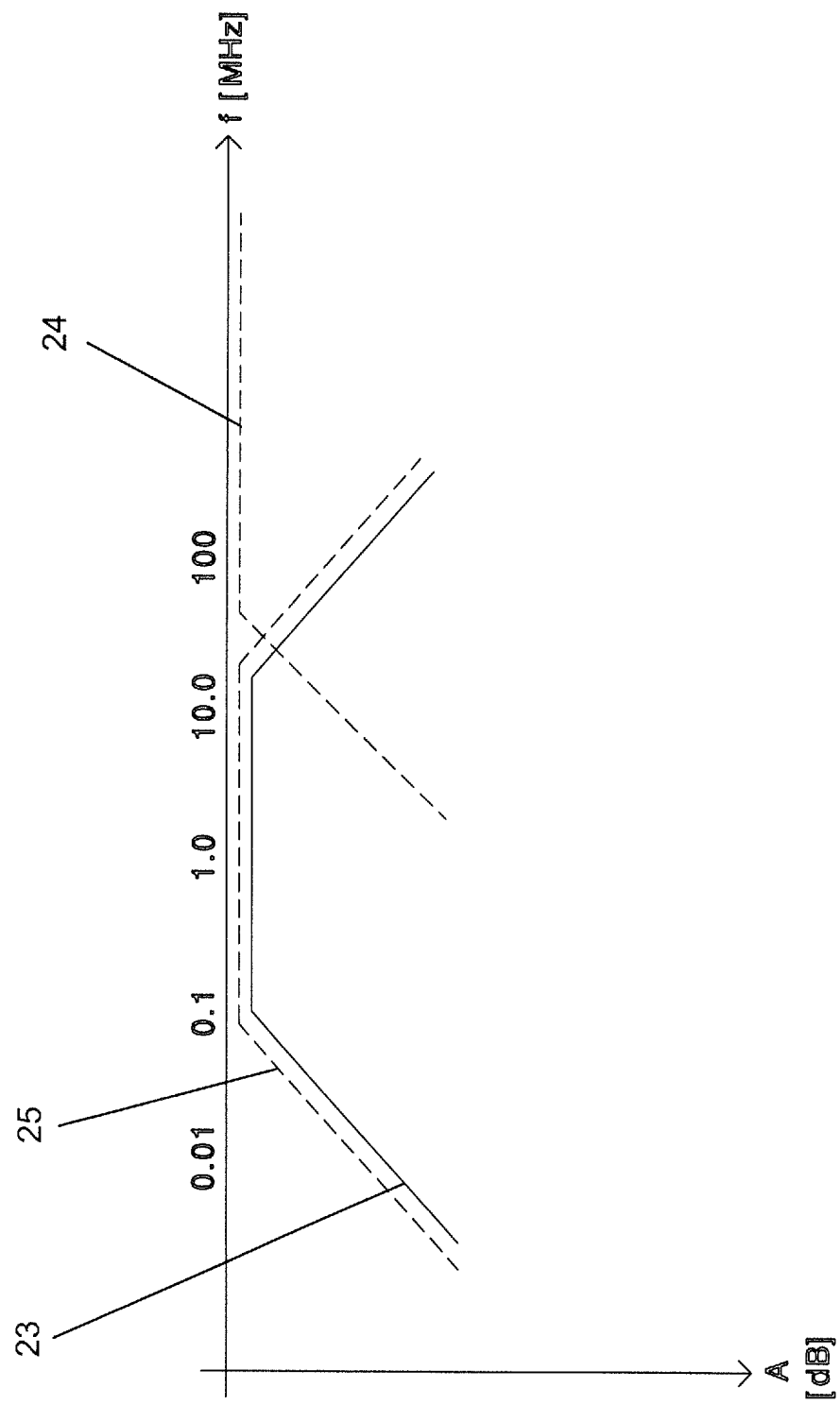
FIG. 2 shows a representation of the frequency response.

The overall frequency response associated with the voltage testing system 3, in combination with the electrical circuit 8, is represented in FIG. 2 by a solid line 23. Attenuation A in dB is plotted against the frequency f in MHz. A band-pass is thus constituted, the cut-off frequencies of which, in the exemplary embodiment, are 100 kHz and 10-20 MHz.

In comparison thereto, the broken line 24 represents the frequency response which would be produced by the voltage testing system alone 3, in combination with the measurement device 16. Moreover, by way of comparison, the broken line 25 represents the frequency response associated with the employment of the measurement device 16 in conjunction with a conventional HFCT. By means of the circuit 8, in conjunction with the capacitive voltage testing system 3, the frequency response of a conventional HFCT sensor is imitated accordingly.

In FIG. 1, the conductor 1 represents only one phase of a medium-voltage cable, to which the voltage testing system 3 is connected. In analogous manner, voltage testing systems can also be connected to the other phases of a medium-voltage cable (not represented), on the respective terminal sockets of which, in an analogous manner, by the interposition of a circuit 8, a measurement of partial discharges by means of a measurement device 16 is executed.

A circuit 8 and/or a measurement device 16 can also be configured for the simultaneous measurement of all phases.

The frequency response matching resistor 9 is preferably an ohmic resistor, as represented. However, it would also be conceivable and possible for a resistance of this type to be constituted by circuit elements which emulate an ohmic resistor, e.g. by a field effect transistor with a correspondingly actuated channel resistance. For example, an ohmic resistor can also be emulated by operational amplifiers.

The same applies, in principle, in an analogous manner, to the impedance matching resistor 14.

A low-pass filter 12 might also be realized wherein, further to A/D conversion, a corresponding signal processing of the digital signal is executed.

Preferably, at the input of the circuit, a protective circuit is provided, which is not represented in FIG. 1, in order to protect down-circuit components against voltage spikes. Protective circuits of this type for the interception of voltage spikes are known. In particular, semiconductor components, e.g. varistors, diodes or gas arresters, are employed for this purpose.

Figure 3:
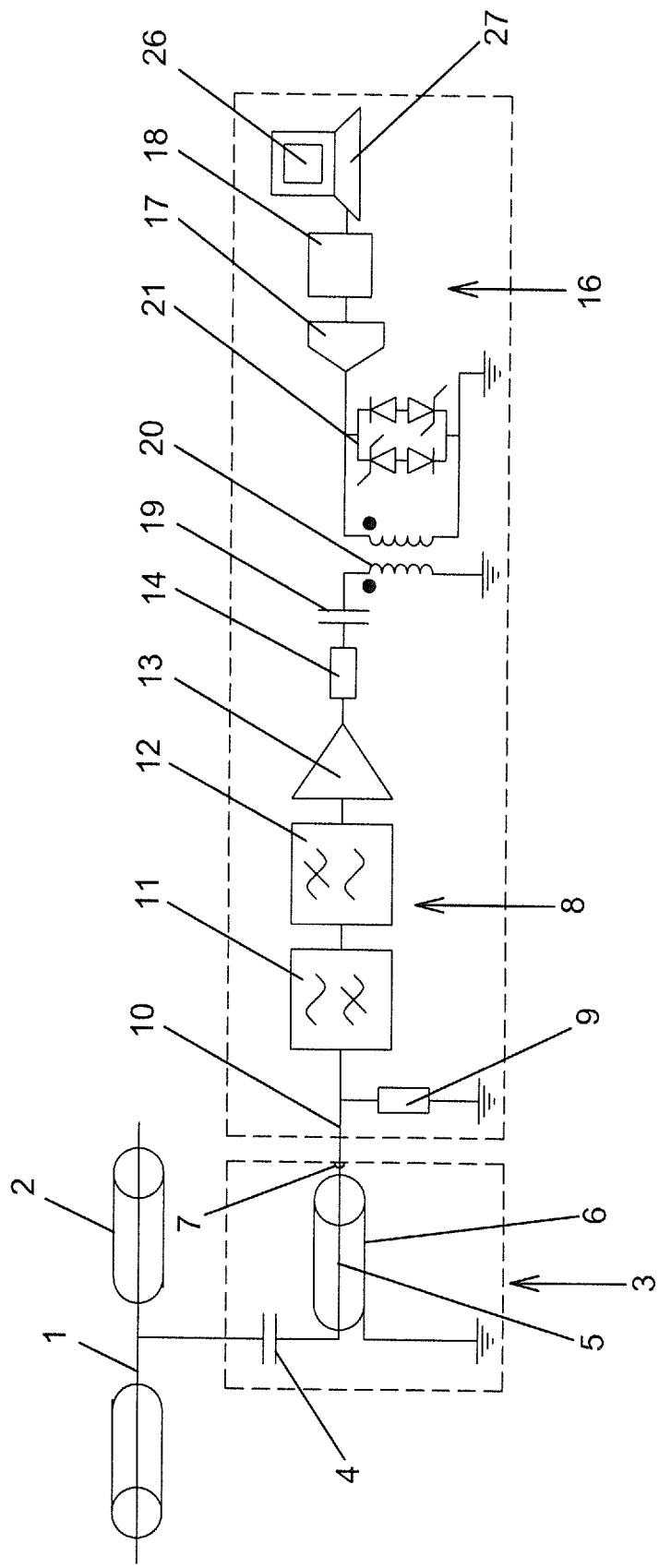
FIG. 3 shows a second exemplary embodiment of the invention.

FIG. 3 represents a second exemplary embodiment of the invention. Differences with respect to the first exemplary embodiment are clarified hereinafter. In other respects, the embodiment represented is comparable to the first exemplary embodiment, in an analogous manner.

In the exemplary embodiment according to FIG. 3, the circuit 8 and the measurement device 16 are accommodated in a common housing, which is represented by a broken line. Components of the circuit 8 and the measurement device 16 correspond to those described with reference to the first exemplary embodiment. Thus, in a single housing, a measuring assembly is accommodated, comprised of the circuit 8 and the measurement device 3, which is connected to the terminal socket 7 of the capacitive voltage testing system 3.

In the second exemplary embodiment, moreover, the functionality of the computer 22, which is connected in the first exemplary embodiment, is directly integrated in the measuring assembly. The measuring assembly thus comprises a monitor 26 and an input/output apparatus 27, particularly comprising a keyboard and/or mouse, which is connected to the microprocessor unit 18. Arrangement in a common housing can be provided, or the monitor 26 and/or the input/output apparatus 27 can comprise a dedicated housing. A corresponding writable memory is also integrated in the microprocessor unit 18.

Alternatively, in the second exemplary embodiment, in an analogous manner to the first exemplary embodiment, the measuring assembly can be provided with a separate computer 22, which is thus connected to the output of the measurement device 16.

Conversely, in the first exemplary embodiment, the functionality of the computer 22, or an element thereof, might be integrated directly in the measurement device 16, in an analogous manner to the second exemplary embodiment.

Figure 4:
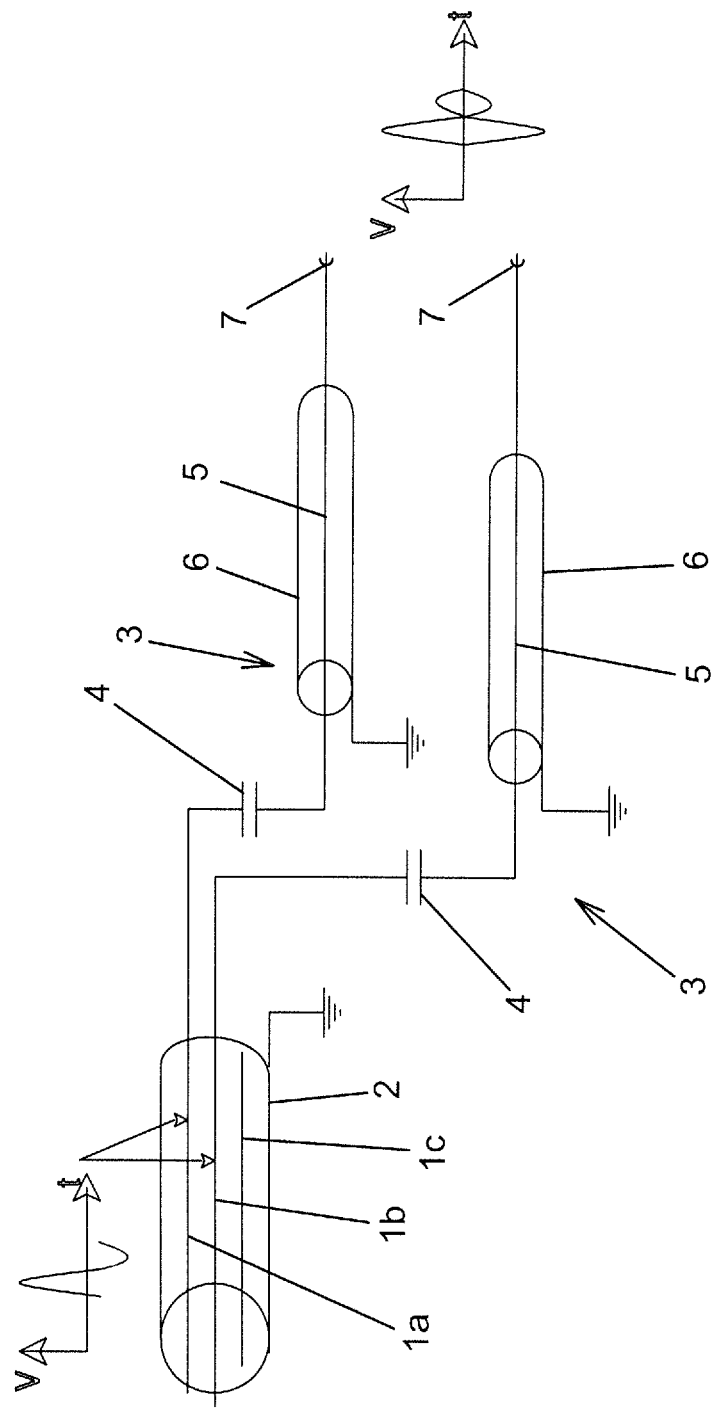
FIG. 4 shows an icon image for the illustration of a third exemplary embodiment of the invention.

A third exemplary embodiment of the invention is described hereinafter with reference to FIG. 4. Differences with respect to the above-mentioned exemplary embodiment are clarified hereinafter. In other respects, descriptions of the above-mentioned exemplary embodiments can be applied in an analogous manner.

The particular purpose of this exemplary embodiment is the measurement of partial discharges in medium-voltage cables in which the conductors 1a, 1b, 1c of all three phases are enclosed in a common cable shielding 2. In cables of this type, partial discharges can not only occur between one phase and the cable shielding, but also between two phases. In turn, all three phases are provided with a respective voltage testing system 3. In FIG. 4, only voltage testing systems 3 for two phases are illustrated. At the outputs of two of the voltage testing systems, a circuit (not represented in FIG. 5) is connected. In this case, the circuit is modified such that the latter comprises two inputs. A differential is thus constituted between these two phases. In the event of the occurrence of partial discharges between these two phases, the resulting voltage pulses on the outputs of the two voltage testing systems 3 which are assigned thereto are of inverse polarity. By the formation of a resulting differential, a two-fold magnitude of the voltage pulse of a respective partial discharge is constituted, whereas interference signals which have identical or similar effects on both phases are eliminated or reduced.

Three such differential measurements can be executed simultaneously, in order to determine partial discharges, in each case, between two of the three conductors 1a, 1b, 1c.

Rather than in the circuit 8, differential formation might also be executed in the measurement device 16. At the two outputs of the voltage testing systems 3, two circuits 8 would thus be connected. The measurement device 16 would then comprise two inputs, which would be connected to the outputs of the two circuits 8.

The circuit might also comprise three inputs for all three phases, wherein the selection of two of the three phases for the purposes of differential formation, by means of appropriate switches, including electronic switches, might be executed. For the execution of differential formation in the measurement device, the latter might comprise three inputs.

A measuring assembly according to the invention, moreover, advantageously comprises a time detection unit for the detection of the time differential between voltage pulses detected by the measuring assembly. The location of a partial discharge in a cable can thus be determined. To this end, the measuring assembly, at one cable end, is connected to a measuring output which is configured, for example, in the form of a terminal socket, of a capacitive voltage testing system of switchgear, and the time difference between the voltage pulse which is routed directly from the location of the partial discharge to the measuring assembly and the voltage pulse which is routed from the location of the partial discharge to the remote cable end, and reflected back from this remote cable end, is detected. By reference to this time difference and the known propagation speed of the voltage pulse, an evaluation unit of the measuring assembly can determine the location of the partial discharge. Statistical methods can be employed for this purpose, wherein a plurality of such events are evaluated.

Figure 5:
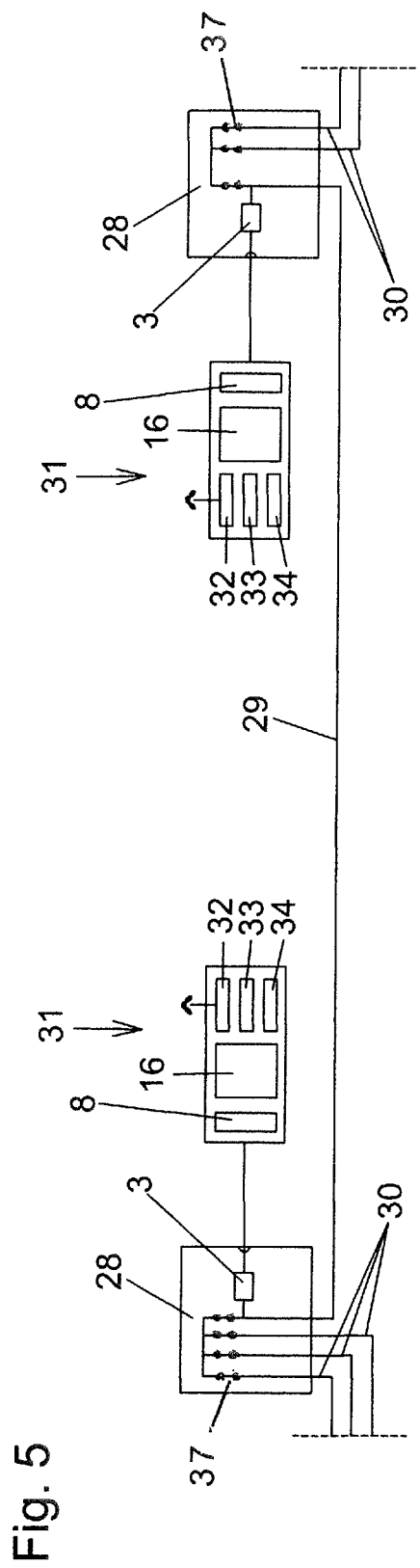
FIG. 5 shows a schematic representation of an exemplary embodiment of a measuring system according to the invention.

For example, in order to determine the location of a partial discharge, even in the case of very long cables (where the partial discharge pulse reflected at the remote cable end cannot be detected, or cannot be reliably detected), the employment of measuring assemblies according to the invention in a measuring system for the identification of the location of a partial discharge (in a power grid having an operating voltage in the range of 1 kV to 69 kV) is schematically represented in FIG. 5. A first and second switchgear 28 are represented, at which a live cable 29 terminates. Each of the respective switchgears 28 comprises a capacitive voltage testing system 3 for the cable 29, which is respectively provided in order to determine whether the cable 29 is live. The capacitive voltage testing systems 3 can be configured in a conventional manner, particularly in an analogous manner to that described with reference to FIGS. 1 and 3. Capacitive voltage testing systems 3 are configured in accordance with IEC standard 61243-5:1997.

Further cables 30, which respectively terminate at one of the switchgears 28, are illustrated in FIG. 5. Switches 27 are also illustrated.

The capacitive voltage testing systems 3, with their respective measurement output, are thus arranged at both ends of the cable 29. At the measurement output of each respective capacitive voltage testing system, a measuring assembly 31 is connected, comprising a circuit 8, which is configured in accordance with the circuit described with reference to FIG. 1 or 3, and a measurement device 16, which is configured in accordance with the measurement device described with reference to FIG. 1 or 3.

Each respective measuring assembly 31 additionally comprises a voltage detection unit 32. The time detection units 32 of both measuring assemblies 31 are synchronized by reference to a common time base. A common time base of this type can be provided, for example, in the form of a GPS time stamp. To this end, an antenna is illustrated on each respective time detection unit 32, which receives likewise illustrated GPS signals. Time synchronization by means of GPS is known.

By means of the time detection units 32, the respective time is determined at which a respective partial discharge pulse (i.e. the voltage pulse associated with a partial discharge) is detected. By the comparison of times at which voltage pulses generated by partial discharges are detected, respective differentials in the propagation times of these voltage pulses to the two measuring assemblies 31 can be determined.

In order to permit communication between the two measuring assemblies 31, the measuring assemblies 31 moreover comprise communication units 33. By means of these communication units 33, wireless communication can preferably be provided between the two measuring assemblies 31, for example via a mobile telephone network. Wire-based communication (by means of glass-fiber conductors, Internet or intranet systems) is also conceivable and possible.

At least one of the measuring assemblies 31 further comprises an evaluation unit 34, by which an evaluation of the measurement values recorded by the two measuring assemblies 31 is executed. In the exemplary embodiment, the measuring assemblies 31 are configured identically, such that each of the measuring assemblies comprises an evaluation unit, wherein evaluation is executed by one of the measuring assemblies 31, which is operated as a "master". The other measuring assembly 31 is thus operated as a "slave", wherein more than one such further measuring assembly can also be provided, as described below.

From the differential in the propagation times of a voltage pulse generated by a partial discharge to the two measuring assemblies 31, the length of the cable 29 and the known propagation speed of the voltage pulse, the evaluation unit 34 determines a distance of the location of the partial discharge from the relevant cable end. The location in the cable 29 at which the partial discharge has occurred can thus be identified. Preferably, a plurality of measurements are considered in this evaluation.

In principle, the evaluation unit 34 might also be a separate device, which communicates with the measuring assemblies 31, or to which measurement values obtained further to the execution of measurements are routed.

Figure 6:
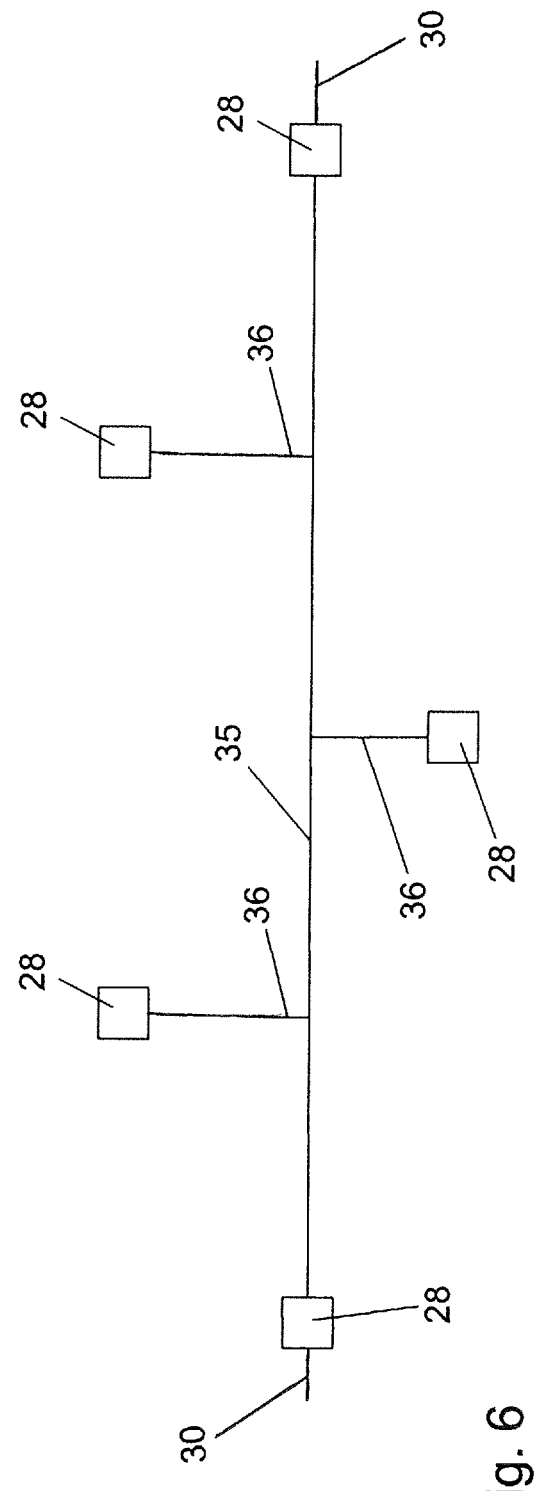
FIG. 6 shows a schematic representation of a T-branch cable.

The method is also employable in "T-branch" cables. An exemplary arrangement to this effect is schematically represented in FIG. 6. Branch lines 36 tap-off from a main line 35. At the ends of the main line 35, and at the ends of the branch lines 36, switchgear 28 is arranged in each case. Each of the switchgears 28 respectively comprises a capacitive voltage testing system for the cable (not represented in FIG. 6). If, in addition to the arrangement of measuring assemblies according to FIG. 5 at both ends of the main line, measuring assemblies of this type are also provided at the end of one or more, or of all the branch lines 36, wherein all the measuring assemblies are time-synchronized, identification of the location of a partial discharge in a T-branch cable can be improved. In this case, identification in the region of the branch lines is also permitted accordingly.

Time synchronization between two or more measuring assemblies can also be executed other than in a GPS-based manner, for example by means of optical glass-fiber transmission. In the event of a sufficiently high accuracy of the time detection units, it would also be conceivable and possible for measuring assemblies 31 firstly to be synchronized in a common location, and only transported to their respective sites of installation thereafter.

The measuring assemblies 31 are respectively microprocessor systems. The time detection unit, the communication unit and the evaluation unit are to be understood as functional units within a microprocessor system of this type, and are generally divided into physical components, for example a microprocessor, memory chips, etc. It can advantageously be provided that each of the respective measuring assemblies according to FIG. 5 is also configured for individual employment in a voltage testing system at a cable end, in order to determine the location of a partial discharge from the time difference between the partial discharge pulse which is routed directly to this cable end and the partial discharge pulse which is reflected from the remote cable end, as described above. This time difference can then be determined by means of the time detection unit 32 and evaluated by the evaluation unit 34.

A capacitive voltage testing system can be coupled by various means to the cable conductors of the power grid. For example, the coupling capacitor of a capacitive voltage testing system of this type can also be accommodated in an insulator or a cable connector, or can also be fitted separately. Although, in many situations, it is advantageous that the measurement output of the capacitive voltage testing system is provided in the form of a terminal socket, this is not absolutely necessary. Accordingly, the measurement output of the capacitive voltage testing system might also be wired directly to the circuit according to the invention.

KEY TO REFERENCE NUMBERS

1 Conductor
1a Conductor
1b Conductor
1c Conductor
2 Cable shielding
3 Voltage testing system
4 Coupling capacitor
5 Conductor
6 Shielding
7 Terminal socket
8 Circuit
9 Frequency response matching resistor
10 Input line
11 High-pass filter
12 Low-pass filter
13 Amplifier
14 Impedance matching resistor
15 Output line
16 Measurement device
17 Analog/digital converter
18 Microprocessor unit
19 Capacitor
20 One-to-one transformer
21 Diode protection circuit
22 Computer
23 Line
24 Line
25 Line
26 Monitor
27 Input/output apparatus
28 Switchgear
29 Cable
30 Cable
31 Measuring assembly
32 Time detection unit
33 Communication unit
34 Evaluation unit
35 Main line
36 Branch line
37 Switch

The invention claimed is:

1. An electrical circuit for connecting an electrical measurement device, which is configured for measurement of partial discharges in a power grid having an operating voltage in a range of 1 kV to 69 kV, and which includes an A/D converter for converting a measured voltage pulse into a digital signal, and a microprocessor for evaluating the digital signal, with a measurement output of a capacitive voltage testing system of switchgear for the power grid which has an operating voltage in the range of 1 kV to 69 kV, the electrical circuit comprising:
 a frequency response matching resistor, which is connected between an input line configured for connection to a live pole of the measurement output and ground, and
 a high-pass filter connected down-circuit of the frequency response matching resistor.

2. The electrical circuit as claimed in claim 1, the measurement output of the capacitive voltage testing system is configured as a terminal socket.

3. The electrical circuit as claimed in claim 1, wherein a rating of the frequency response matching resistor is greater than 25 kΩ.

4. The electrical circuit as claimed in claim 3, the rating of the frequency response matching resistor is in a range of 50 kΩ to 200 kΩ.

5. The electrical circuit as claimed in claim 1, wherein a cut-off frequency of the high-pass filter is in a range of 50 kHz to 200 kHz.

6. The electrical circuit as claimed in claim 1, further comprising a low-pass filter connected down-circuit of the frequency response matching resistor.

7. The electrical circuit as claimed in claim 6, further comprising an amplifier connected down-circuit of the high-pass filter and the low-pass filter.

8. The electrical circuit as claimed in claim 7, further comprising an impedance matching resistor arranged down-circuit of the amplifier, configured for impedance matching to the input resistor of the measurement device.

9. A measuring assembly for the measurement of partial discharges at a measurement output of a capacitive voltage testing system of switchgear for a power grid having an operating voltage in the range of 1 kV to 69 kV, the measuring assembly comprising:
 an A/D converter configured to convert a measured voltage pulse into a digital signal,
 a microprocessor configured to evaluate the digital signal, and
 the electrical circuit as claimed in claim 1 arranged up-circuit of the A/D converter.

10. The measuring assembly as claimed in claim 9, wherein the measurement output of the capacitive voltage testing system is configured as a terminal socket.

11. The measuring assembly as claimed in claim 9, wherein for the measurement of partial discharges between two conductors in a multi-pole cable for voltages in the range of 1 kV to 69 kV, the microprocessor is configured to mutually subtract measurement signals obtained from partial discharge measurements on the two conductors.

12. The measuring assembly as claimed in claim 9, further comprising a time detection unit for detection of a time differential between voltage pulses which are detected by the measuring assembly for the identification of a location of a partial discharge.

13. A measuring system for the identification of the location of a partial discharge in a power grid having an operating voltage in the range of 1 kV to 69 kV, the measuring system comprising at least two of the measuring assemblies as claimed in claim 9 for the measurement of partial discharges on a respective measurement output of a capacitive voltage testing system arranged at a respective end of a cable in the power grid, and the measuring assemblies further comprise mutually synchronizable time detection units configured to detect a difference in propagation times of a voltage pulse generated by a partial discharge to the respective measuring assembly.

14. The measuring system as claimed in claim 13, further comprising at least one evaluation unit configured to evaluate a difference detected in the propagation times of a voltage pulse generated by a partial discharge, in order to determine a location of the partial discharge.

15. The measuring system as claimed in claim 12, wherein the measuring assemblies further comprise communication units for mutual exchange of data.

16. The electrical circuit as claimed in claim 3, wherein the rating of the frequency response matching resistor is lower than 400 kΩ.

17. The electrical circuit as claimed in claim 6, wherein the low-pass circuit has a cut-off frequency in a range of 5 MHz to 20 MHz.

18. The electrical circuit as claimed in claim 8, wherein the impedance matching resistor has a rating of less than 100Ω.

19. The measuring system as claimed in claim 15, wherein the mutual exchange of data is wireless.

* * * * *